United States Patent [19]
Ushikawa et al.

[11] Patent Number: 5,536,320
[45] Date of Patent: Jul. 16, 1996

[54] PROCESSING APPARATUS

[75] Inventors: Harunori Ushikawa, Sagamihara; Kenji Tago, Kofu, both of Japan

[73] Assignee: Tokyo Electron Kabushiki Kaisha, Tokyo-to, Japan

[21] Appl. No.: 206,150

[22] Filed: Mar. 7, 1994

[30] Foreign Application Priority Data

Mar. 10, 1993 [JP] Japan .................................... 5-076174

[51] Int. Cl.⁶ .................................................. C23C 16/00
[52] U.S. Cl. .......................... 118/719; 118/715; 414/217; 414/938
[58] Field of Search ..................... 118/715, 719; 414/217, 938

[56]  References Cited

U.S. PATENT DOCUMENTS

| | | | |
|---|---|---|---|
| 4,962,726 | 10/1990 | Matsushita ............................... | 118/719 |
| 5,219,464 | 6/1993 | Yamaga et al. ........................... | 55/213 |
| 5,221,201 | 6/1993 | Yamaga et al. .......................... | 432/241 |
| 5,236,181 | 8/1993 | Ishii et al. ................................ | 266/252 |
| 5,261,167 | 11/1993 | Sakata ........................................ | 34/82 |

*Primary Examiner*—Richard Bueker
*Attorney, Agent, or Firm*—Beveridge, DeGrandi, Weilacher & Young

[57] ABSTRACT

A waiting space is provided below a processing vessel for processing objects to be processed. An objects to be processed mount which is movable up and down into the processing vessel is disposed in the waiting space for mounting objects to be processed. There is provided a natural oxide film generation suppressing gas supply system which supplies a natural oxide film generation suppressing gas for suppressing generation of natural oxide films on the surfaces of the objects to be processed, and a dried gas with a low dew point is supplied as a natural oxide film generation suppressing gas by the natural oxide film generation suppressing gas supply system. The processing apparatus can suppress generation of natural oxide films inexpensively and efficiently.

14 Claims, 3 Drawing Sheets

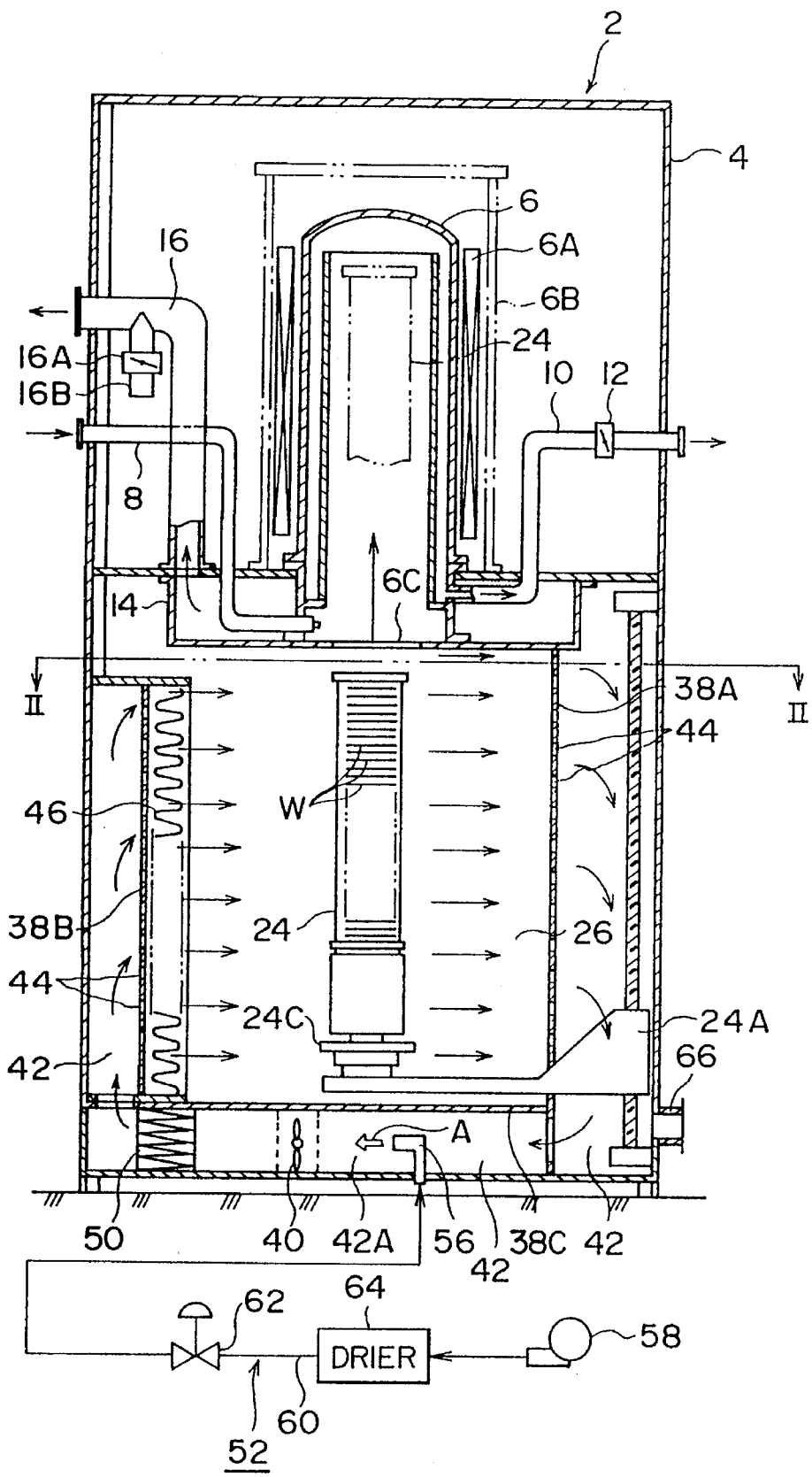
F I G. 1

PROCESSING APPARATUS

BACKGROUND OF THE INVENTION

The present invention relates to a processing apparatus for processing objects to be processed, e.g., a vertical heat treatment apparatus.

Vertical heat treatment apparatuses, which can be cleaned, save space, etc., are generally used as treatment apparatuses for thermal diffusion steps and film forming steps of semiconductor device fabrication processes.

In such vertical heat treatment apparatus, a heat treatment furnace comprising a heater surrounding a cylindrical treatment vessel of quartz, a heat insulating material, etc. is vertically disposed in an upper part of the interior of a substantially rectangular casing. Below the heat treatment furnace in the casing there is provided a waiting space for a wafer boat with a number of semiconductor wafers or objects to be treated mounted thereon. The wafer boat stands by in the waiting space and is loaded or unloaded into or from the heat treatment furnace by lift means, e.g., a boat elevator.

By the use of such heat treatment apparatus, for example, various films, e.g., insulating films of $SiO_2$ or others, are formed. In forming such films, the wafers are exposed to clean air in a wafer conveying system immediately before the film formation, and natural oxide ($SiO_2$) films are adversely formed on the surfaces of the wafers. Characteristics of such natural oxide films are not good, as are characteristics of artificially formed oxide films by deposition or other techniques, and it is preferred to remove the natural oxide films as much as possible immediately before the films are formed. To this end a cleaning step of removing the natural oxide films formed on the surfaces of the wafers is incorporated. But the wafers are exposed to clean air after the cleaning on the way to the heat treatment apparatus for forming the films, and while standing by in the waiting space after being conveyed thereinto; thus, natural oxide films are again formed thereon.

Natural oxide films adversely formed by the start of the film formation are not serious in terms of device characteristics in a case of not so high integration. But in a case of high integration, as of 64M bits, or 256M bits, because the $SiO_2$ films to be deposited in these situations are thinner, the natural oxide films affect device characteristics in a non-negligible manner. For example, when a total thickness of a $SiO_2$ film including a 20 Å-natural oxide film is 100 Å, a ratio occupied by the natural oxide film is insignificantly about 20%. But as described above, in a case of high integration, when a total thickness of a $SiO_2$ film is a half of the above-described thickness, i.e., 50 Å, a ratio of the natural oxide film is as high as 40% which is non-negligible in terms of device characteristics.

Generally, the formation of natural oxide films depend on heat, water and oxygen concentrations.

A known structure for suppressing the generation of natural oxide films after cleaning wafers comprises the above-described waiting space for the wafers with the wafers that are standing by placed in an atmosphere of an inert gas, such as $N_2$ (nitrogen) or others, and a load lock chamber in communication with the waiting space and placed in a vacuum or an atmosphere of an inert gas, such as $N_2$ or others. In this way the wafers are kept as much as possible from contacting with clean air. A known lower level structure does not include the load lock chamber and includes only the waiting space, whereby clean air whose $O_2$ (oxygen) is replaced with $N_2$ to lower its $O_2$ concentration to about 30 PPM, a natural oxide film suppressing gas, is circulated so as to suppress generation of the natural oxide films.

The above-described structure including the load lock chamber not only additionally requires the load lock chamber, but also has to use a large amount of expensive $N_2$ gas. Thus higher equipment costs and running costs are necessary in order to greatly suppress the generation of natural oxide films.

The structure, which does not include the load lock chamber and which circulates the natural oxide film suppressing gas in the waiting space, does suppress the generation of natural oxide film and lowers equipment costs as compared with the structure that includes the load lock chamber. However, a large amount of expensive $N_2$ gas is required under this technique so as to raise running costs, and this is a problem with this prior structure.

The present invention has been successfully made in view of this problem. An object of the present invention is to provide a processing apparatus which recirculates an inexpensive dry gas with a low dew point, whereby generation of natural oxide films can be suppressed.

With respect to suppressing the generation of natural oxide films, conventionally the oxygen concentration alone in a natural oxide film generation suppressing gas has been suppressed. The inventors have found that, based on results of their studies, the generation amount of natural oxide films does not depend on $O_2$ concentrations when the water content in the natural oxide film generation suppressing gas is suppressed. By suppressing the water content the film generation can be suppressed to be small. Based on this finding, they have made the present invention.

To solve the above-described problem, the present invention relates to a processing apparatus comprising a processing vessel for processing objects to be processed; an objects mount for mounting the objects to be processed and being movable up and down into and out of the processing vessel through the bottom thereof; a waiting space provided below the processing vessel where the object mount stands by; and a natural oxide film generation suppressing gas supply system for supplying a natural oxide film generation the suppressing gas for suppressing generation of natural oxide films on the objects-to-be-processed in the waiting space, the natural oxide film generation suppressing gas being dried gas (air) with a low dew point.

In the processing apparatus of the present invention having the above-described constitution, the objects mount with objects to be processed is housed in the waiting space below the processing vessel, and the waiting space is supplied with a dry gas having a dew point by the natural oxide film generation suppressing system. Accordingly generation of natural oxide films on surfaces of the objects to be processed can be minimized.

BRIEF DESCRIPTION OF THE DRAWINGS

FIG. 1 is a vertical sectional view of a vertical heat treatment apparatus according to an embodiment of the present invention in which the processing apparatus of the present invention is used.

DETAILED DESCRIPTION OF PREFERRED EMBODIMENTS

Figure 2:
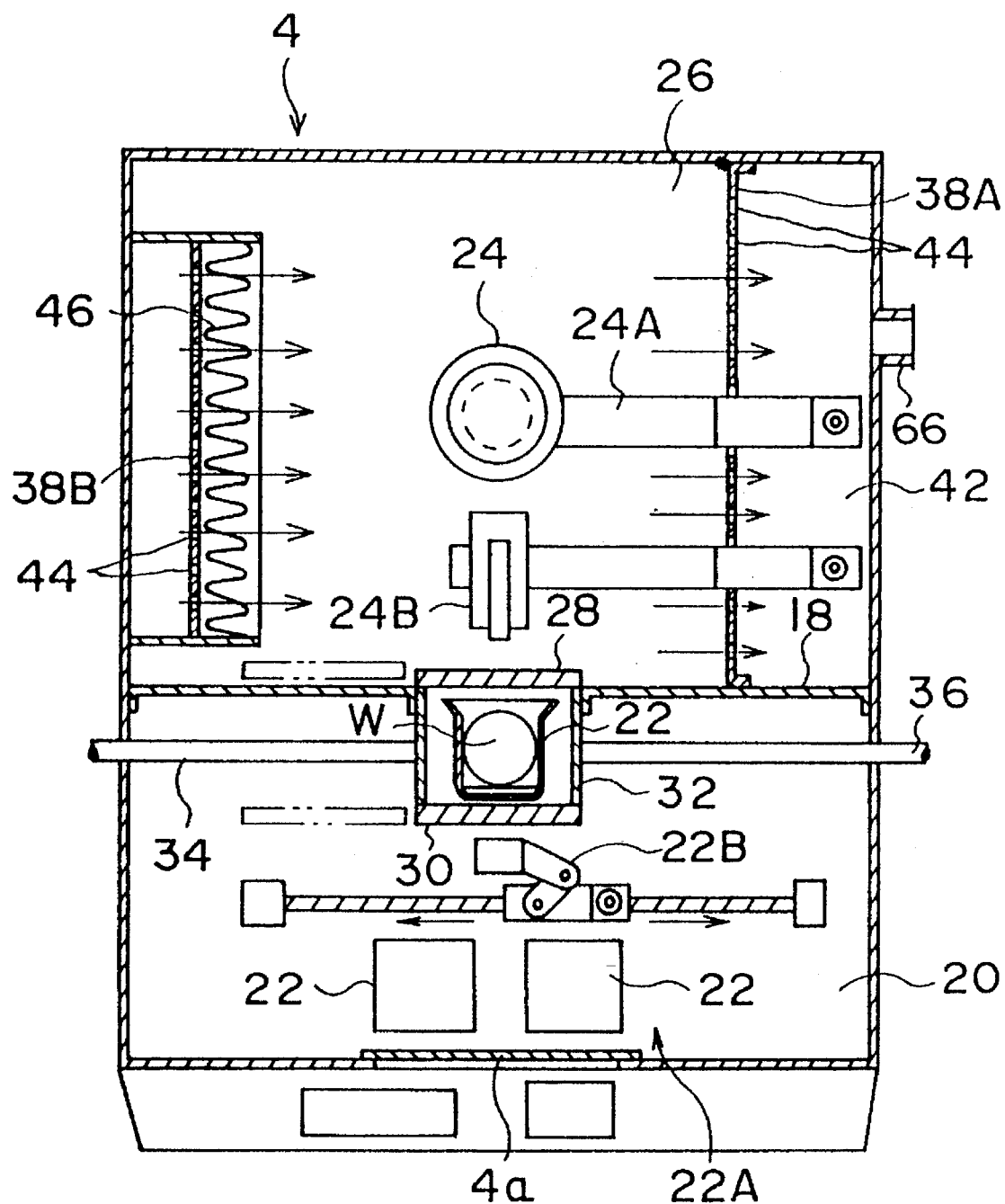
FIG. 2 is a sectional view of the vertical heat treatment apparatus of FIG. 1 along the line II—II.

A vertical heat treatment apparatus according to an embodiment of the present invention in which the processing apparatus according to the present invention is used will be explained with reference to the drawings attached hereto.

In this embodiment the processing apparatus is used as a vertical CVD apparatus. As shown in FIG. 1, the vertical CVD apparatus 2 as the processing apparatus includes a rectangular casing 4 of, e.g., stainless steel, and a cylindrical processing vessel 6 of quartz in an upper part of the interior of the casing 4. The processing vessel (process tube) 6 is surrounded by a heater 6A and a heat insulating material 6B, which constitute a heat treatment furnace.

To the sides of the processing vessel 6 at lower parts thereof there are connected a processing gas introduction pipe 8 for feeding a processing gas into the processing vessel, and a processing gas exhaust pipe 10 for exhausting used processing gas out of the processing vessel 6. A first autodamper 12 is inserted in the exhaust pipe 10. A scavenger 14 is provided on the bottom of the processing vessel 6 for exhausting a high-temperature atmosphere flowing down in the processing vessel 6 when objects to be processed W are loaded/unloaded into/from the processing vessel 6. The scavenger 14 is connected to an exhaust pipe 16 through a branched pipe 16B and an autodamper inserted therein for exhausting outside the atmosphere in the scavenger. An objects mount for loading/unloading the objects W into/from the processing vessel 6, such as wafer boat 24 formed of, e.g., quartz, is provided movably up and down below the processing vessel 6. The wafer boat 24 accommodates a number of the objects W, e.g., sheets of semiconductor wafers positioned horizontally at a set vertical pitch.

As shown in FIG. 2, a lower part of the interior of the casing 4 is bisected into two spaces by a partition 18. One of the two spaces is an objects loading/unloading box 20. In the box 20 there is provided a carrier station 22A which can accommodate two carriers 22 each carrying a set number of objects W, e.g., 25 sheets of semiconductor wafers. The carriers 22 are loaded/unloaded into the carrier station 22A through a gate valve 4a.

The other of the two spaces is a waiting space 26 where the wafer boat 24 stands by. In the partition 18 bisecting the two spaces there is provided a box-shaped transfer box 32 having doors 28, 30 openable by, e.g., a gate valve. The transfer box 32 is connected to a gas introduction pipe 34 connected to a dry gas source or a purge gas source, and to a gas exhaust pipe 36 connected to a vacuum pump or others, so that the interior of the transfer box 32 is purged as required and evacuated. The carriers 22 are loaded/unloaded into/from the box 32 by a convey robot 22B.

As shown in FIG. 1, the wafer boat 24 is movable up and down in the waiting space 26 by lift means 24A and is moved up and down as required. On the sides and the bottom of the waiting space 26 partition walls 38A, 38B, 38C are provided at a small distance from the sides of casing 4. A space defined by the partition walls 38A, 38B, 38C is a circulation passage 42 through which a natural oxide film generation suppressing gas, which will be described later, is circulated. The partition walls 38A, 38B defining the sides have a number of gas holes 44 through which the circulated gas is passed. A filter 46, e.g., ULP (Ultra Low Penetration) filter is provided on one 38B of the partition wall for adsorbing to remove particles drifting in the waiting space 26.

A blowing fan 40 for forcedly circulating the gas in the circulation passage 42, and a radiator 50 for suppressing temperatures of the circulated gas are sequentially inserted in the circulation passage 42, e.g., the bottom passage 42A. To the thus arranged waiting space 26 is connected a natural oxide film generation suppressing gas supply system 52 which is characteristic of the present invention.

The natural oxide film generation suppressing gas supply system 52 includes a gas injection nozzle 56 opened in the bottom passage 42A through the bottom of the casing 4. The nozzle 54 is connected to a gas supply pipe 60 which is connected to a blower 58 for introducing clean air. The gas injection nozzle 56 is not limited to this arrangement and may have various arrangements. In the gas supply pipe 60 there are inserted a flow rate control valve 62, and a drier 64 filled with a purifier, such as activated charcoal or others, for drying the gas flowing therethrough. In the drier 64 the gas flowing therethrough is dried so that its dew point is below −60° C., preferably −70° C. The clean gas is thus highly dried, whereby, as will be described later, generation of natural oxide films can be greatly suppressed.

The drier 64 may be multi-staged if necessary to dry the gas flowing therethrough to a set dew point. As shown in FIG. 2, a dried gas is supplied to the transfer box 32 through the gas introduction pipe 34 to dry the wafers W in the carriers 22.

The drier 64 is not necessarily limited to the type that uses activated charcoal to adsorb water molecules and may be of any type as long as dew points of the gas can be lowered. Reference numeral 66 represents an exhaust pipe for discharging outside part of the circulating gas.

Then the operation of the heat treatment apparatus according to this embodiment having the above-described structure will be explained.

Twenty-five sheets, for example of, wafers W to be processed with natural oxide films on the surfaces removed in a precleaning step are loaded in each carrier 22, and the carriers 22 are conveyed into the loading/unloading box 20 through the gate valve 4a to be mounted on the carrier station 22A. The carriers 22 are transferred into the transfer box 32 by the conveying robot 22B through the gate valve 30. After the gate valve 30 is closed, an interior atmosphere in the transfer box 32 is replaced by the dried air supplied by the natural oxide film generation suppressing gas through the gas introduction pipe 34.

Then the gate valve 28 of the transfer box 32 on the side of the waiting space 26 is opened to transfer the wafers onto the wafer boat 24 by a conveying arm 24B one by one or by some sheets. When the transfer of the wafers W is over, the wafer boat 24 is lifted by the lift means 24A and entirely loaded in the processing vessel 6 on the transfer box 32 with a bottom opening 6C of the processing vessel 6 closed with a lid portion 24C of the wafer boat on the lower part thereof.

In this state the wafers W are heated up to a set temperature, a processing gas is introduced into the processing vessel 6, and a heat treatment is conducted for a set period of time. When the heat treatment is over, the above-described operation is reversely conducted to lower the wafer boat 24 and take out the wafers W out of the processing vessel 6 into the waiting space 26. The wafers W are further conveyed into the loading/unloading box 20.

In the processing apparatus according to the present invention, during a string of these processing steps, a highly dried air for drying is supplied by the natural oxide film generation suppressing gas supply system 52 is being supplied in the waiting space 26, whereby generation of natural oxide films on the surfaces of the wafers W in the waiting space 26 can be suppressed.

That is, clean air introduced by the blower 58 has content water removed by the drier 64 to be highly dried up to a dew point, e.g., −70° C. and introduced into the circulation passage 42 from the gas injection nozzle 56. The introduced dried gas A is circulated in the waiting space 26 through the circulation passage 42 to contact the surfaces of the wafers W mounted on the wafer boat 24 so as to suppress generation of natural oxide films on the surfaces.

Particles contained in the atmosphere are captured and removed by the filter 46 provided in the exit of the circulation passage 42, i.e., in a side of the waiting space. The atmosphere heated by residual heat of the heat-treated wafers W is cooled by the radiator 50 inserted in the circulation passage 42 so as to retain a set temperature.

Because of the gas injection nozzle 56 opened in the circulation passage 42, the dried air injected from the nozzle 56 is circulated through the waiting space 26 so that atmospheric air components and particles staying on the surfaces of the wafers can be removed by the time when the wafers W are loaded into processing vessel 6. The dried air can forcedly cool the wafers W when a heat treatment is over, and the wafers W are lowered to be taken out of the processing vessel 6. To improve effects of the cooling and the particle removal, it is preferred to suitably adjust the supply amount of the dried air and the revolutions of the blowing fan 40 for a circulated gas amount to form an optimum wall.

Figure 3:
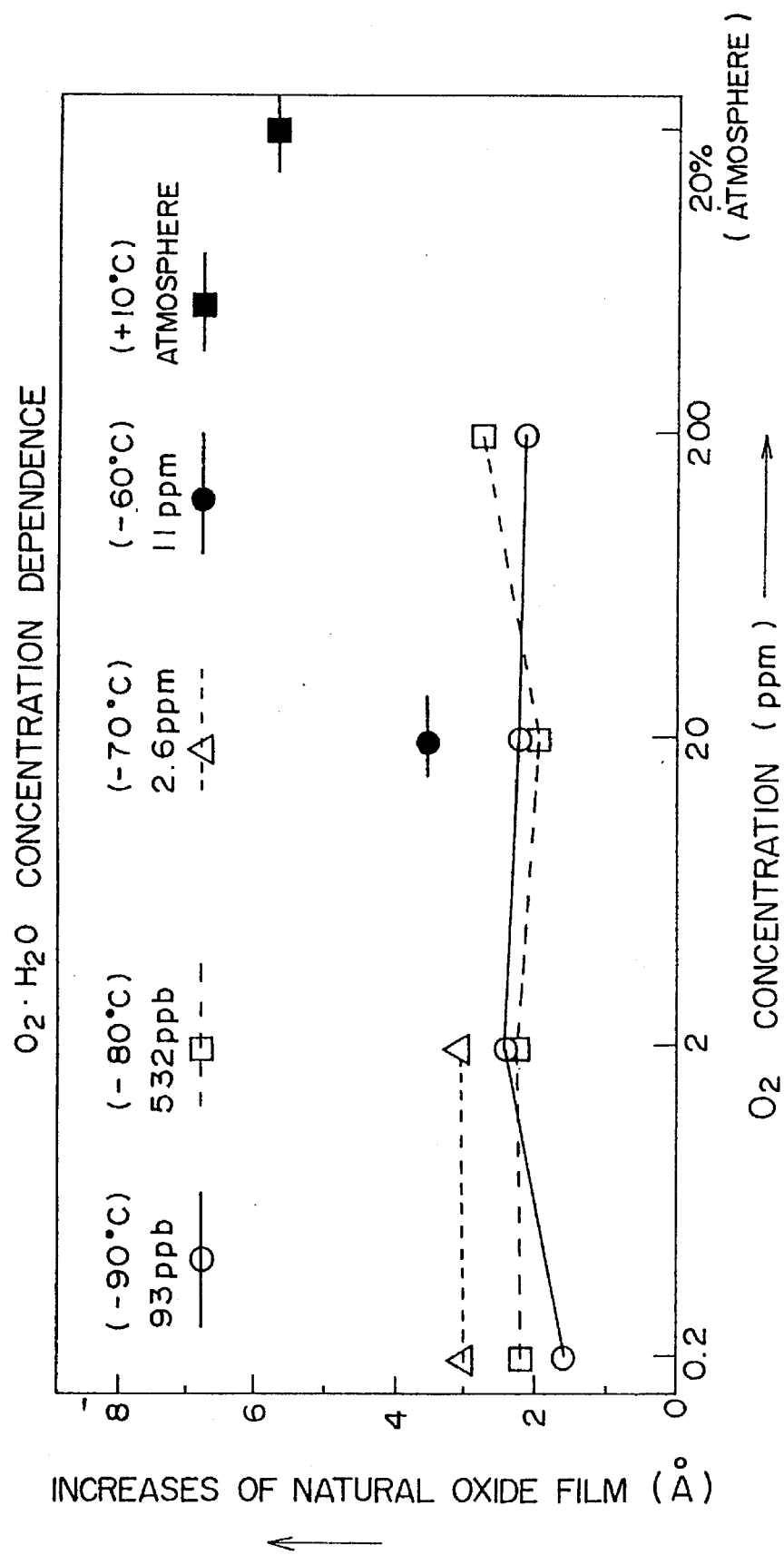
FIG. 3 is a graph of relationships among water concentrations, oxygen concentrations and natural oxide film increases.

The inventors' studies of $O_2.H_2O$ dependence of natural oxide film generation amount increases will be explained with reference to FIG. 3. The graph of FIG. 3 shows increases of natural oxide film (differences of the natural oxide film between after being cleaned and after being heat treated) measured when flow rates of $O_2$ and $H_2O$ are gradually increased in a state where a 20 SLM (20 l/min) of pure nitrogen is being supplied to the waiting space at a 800° C. treatment temperature. The content water concentrations 93 ppb (○), 532 ppb (□), 2.6 ppm (△), and 11 ppm (●) respectively correspond to dew points approximately of—90° C., −80° C., −70° C. and −60° C. The atmospheric air used as the clean air has a dew point of around +10° C. As evident from the graph of FIG. 3, an increase of the oxide film at an about −60° C. dew point of the dried gas is 3.8 Å, and at dew points below that dew point a further rise in oxygen concentration essentially does not influence increases in the natural oxide films. Thus it has been found that generation of the natural oxide films can be suppressed. Especially with a dew point below −70° C., the generation of the natural oxide film can be suppressed below 3 Å, which is a satisfactory result.

Thus a gas is dried to retain its dew point low, whereby a generation amount of the natural oxide films can be suppressed irrespective of oxygen concentrations of the gas.

In the above-described embodiment, dried air is used as the natural oxide film generation suppressing gas A but is not necessarily limited to it. The dried air may contain an inert gas, e.g., nitrogen or others for the improvement of the effect as long as its dew point can be retained low.

In the above-described embodiment, the processing device has been explained by means of a vertical heat treatment apparatus. But the processing apparatus is not limited to it and is applicable to processing apparatuses for suppressing generation of natural oxide films.

As described above, the processing apparatus according to the present invention can achieve the following good functional advantageous effects.

By the use of a natural oxide film generation suppressing gas whose dew point is lowered, generation amounts of natural oxide films can be greatly decreased. The use of especially dried air with a low dew point as the suppressing gas can achieve the same natural oxide film generation suppressing effect as the use of an expensive inert gas, such as nitrogen or others, and running costs of a heat treatment can be much reduced.

What is claimed is:

1. A processing apparatus comprising:

a processing vessel for processing objects to be processed;

an objects mounting means for mounting the objects to be processed and being movable up and down into and out of the processing vessel through an opening provided at the bottom thereof;

an enclosed waiting space provided below the processing vessel and maintained always at an atmospheric pressure or a pressurized atmosphere where the object mounting means stands by; and a natural oxide film generation suppressing gas supply means for supplying air containing $O_2$ and for lowering a dew point level of the air containing $O_2$ for suppressing generation of natural oxide films on the object to be processed in the waiting space.

2. The processing apparatus according to claim 1, wherein said natural oxide film generation suppressing gas supply means provides the natural oxide film generation suppressing gas at a dew point below −60° C.

3. The processing apparatus according to claim 1, wherein the natural oxide film generation suppressing gas supply means includes an injection nozzle for injecting the natural oxide film generation suppressing gas into said waiting space.

4. The processing apparatus according to claim 1, wherein the natural oxide film generation suppressing means comprises:

a blower for introducing clean air;

a drier for drying the clean air;

a flow rate control valve, and a gas injection nozzle; wherein these members are connected to each other by a gas supply pipe.

5. The processing apparatus according to claim 1, wherein the natural oxide film generation suppressing gas supply means includes a circulation passage defined between a bottom and sides of the waiting space, and partition walls provided in the waiting space, and a gas injection nozzle opened in a bottom of the circulation passage.

6. The processing apparatus according to claim 5, wherein partition walls positioned at sides of the waiting space have a number of gas holes, and a partition wall on a gas inflow side includes a filter for removing particles from the gas.

7. The processing apparatus according to claim 1, wherein a box-shaped transfer box is disposed on the bottom of the waiting space, and the transfer box is connected to a gas introduction pipe and a gas exhaust pipe for supplying the natural oxide film generation suppressing gas into the transfer box and evacuating the interior of the transfer box.

8. The processing apparatus according to claim 1, wherein the natural oxide film generation suppressing gas includes the air containing $O_2$ and controlled with a low dew point and an added inert gas.

9. The processing apparatus according to claim 1, wherein the processing apparatus is a vertical heat treatment apparatus.

10. The processing apparatus according to claim 1 wherein the natural oxide film generation suppressing gas supply means includes means for providing the natural oxide film generation suppressing gas at a dew point below −70° C.

11. A processing apparatus comprising:

a processing vessel for processing objects to be processed;

an objects mounting means for mounting the objects to be processed and being movable up and down into and out of the processing vessel through an opening provided at a bottom thereof;

a waiting space provided below the processing vessel where the object mount stands by; and a natural oxide film generation suppressing gas supply means for supplying a natural oxide film generation suppressing gas for suppressing generation of natural oxide films on the objects to be processed in the waiting space, and wherein the natural oxide film generation suppressing gas is dried gas with a low dew point and wherein the natural oxide film generation suppressing means comprises:

a blower for introducing clean air;
a drier for drying the clean air;
a flow rate control valve, and
a gas injection nozzle; wherein
said blower, drier, flow rate control valve and gas injection nozzle are connected to each other by a gas supply pipe.

12. A processing apparatus comprising:

a processing vessel for processing objects to be processed;

an objects mounting means for mounting the objects to be processed and being movable up and down into and out of the processing vessel through an opening provided at the bottom thereof;

a waiting space provided below the processing vessel where the object mounting means stands by; and a natural oxide film generation suppressing gas supply system in gas flow communication with said waiting space, said gas supply system including an air supply pipe and an air dryer in line with said air supply pipe which dryer dries the air passing therethrough to a dew point below −60° C.

13. The processing apparatus according to claim 12 wherein the air dryer drys the air passing therethrough to a dew point below −70° C.

14. The processing apparatus according to claim 12 wherein said gas supply system includes a blower for forcing air along said supply pipe;

a flow rate control valve in line with said supply pipe; and
a gas injection nozzle which is in line with said supply pipe and positioned downstream from said dryer.

* * * * *